United States Patent
Mu et al.

(10) Patent No.: US 8,681,894 B2
(45) Date of Patent: Mar. 25, 2014

(54) DIGITAL AFFINE TRANSFORMATION MODULATED POWER AMPLIFIER FOR WIRELESS COMMUNICATIONS

(75) Inventors: Fenghao Mu, Hjärup (SE); Sven Mattisson, Bjärred (SE)

(73) Assignee: Telefonaktiebolaget L M (publ), Stockholm (SE)

( * ) Notice: Subject to any disclaimer, the term of this patent is extended or adjusted under 35 U.S.C. 154(b) by 887 days.

(21) Appl. No.: 12/611,677

(22) Filed: Nov. 3, 2009

(65) Prior Publication Data

US 2011/0103508 A1    May 5, 2011

(51) Int. Cl.
H04L 27/00    (2006.01)

(52) U.S. Cl.
USPC .................. 375/295; 375/302; 375/308

(58) Field of Classification Search
USPC .................................... 375/295, 302, 308
See application file for complete search history.

(56) References Cited

U.S. PATENT DOCUMENTS

| | | | |
|---|---|---|---|
| 6,690,233 B2 | 2/2004 | Sander | |
| 7,409,012 B2 | 8/2008 | Martin et al. | |
| 2006/0062324 A1* | 3/2006 | Naito et al. | 375/296 |
| 2006/0291589 A1 | 12/2006 | Eliezer et al. | |
| 2007/0189533 A1* | 8/2007 | Rhoads | 380/247 |

FOREIGN PATENT DOCUMENTS

| | | | |
|---|---|---|---|
| EP | 0503588 A2 | 9/1992 | |
| EP | 1868295 A2 | 12/2007 | |
| WO | 03/005622 A2 | 1/2003 | |
| WO | 2006003722 A2 | 3/2006 | |

OTHER PUBLICATIONS

Xin He, Jan Van Sinderen, "A 45nm Low-Power SAW-less WCDMA Transmit Modulator Using Direct Quadrature Voltage Modulation", ISCC 2009, Session 6, Cellular and Tuner, 6.5, pp. 120-122, 2009 IEEE International Solid-State Circuits Conference.
Kim et al. "A 600MHz CMOS OFDM LINC Transmitter with a 7 Bit Digital Phase Modulator." IEEE Radio Frequency Integrated Circuits Symposium; 2008; pp. 677-680; RTUIF-27; Piscataway, NJ.
Kavousian et al. "A Digitally Modulated Polar CMOS Power Amplier With a 20-MHz Channel Bandwith." IEEE Journal of Solid-state Circuits; Oct. 2008; pp. 2251-2258; vol. 43, No. 10; Piscataway, NJ.
Hetzel et al. "A LINC Transmitter." IEEE 41st Vehicular Technology Conference; May 19-22, 1991; pp. 133-137; St. Louis, MO.
Conradi et al. "Evaluation of a Lossless Combiner in a LINC Transmitter." IEEE Canadian Conference on Electrical and Computer Engineering; May 9-12, 1999; pp. 105-110; Edmonton, Alberta, Canada.

* cited by examiner

*Primary Examiner* — Michael Neff
(74) *Attorney, Agent, or Firm* — Coats & Bennett, P.L.L.C.

(57) ABSTRACT

A digital affine transformation modulator and power amplifier drives a transmitter antenna. The modulator performs an affine transformation on a signal, wherein the I, Q space is mapped to a plurality of sectors. A signal in a sector is expressed as the sum of two vectors, the angles of which define the sector boundaries. A digital power amplifier comprises a plurality of amplifier cells, each cell comprising at least two amplifier units. For a given signal, each amplifier unit selectively amplifies a clock signal having a phase corresponding to one of the boundary angles of the signal's affine transformed sector. A subset of the plurality of amplifier cells receiving each phase clock signal are enabled, based on the magnitude of the associated vector describing the signal in affine transform space. The modulation scheme exhibits higher efficiency than quadrature modulation, without the bandwidth expansion and group delay mismatch of polar modulation.

21 Claims, 17 Drawing Sheets

DIGITAL AFFINE TRANSFORMATION MODULATED POWER AMPLIFIER FOR WIRELESS COMMUNICATIONS

TECHNICAL FIELD

The present invention relates generally to wireless communications, and in particular to a digital affine transformation modulated power amplifier for a transmitter.

BACKGROUND

Mobile communication systems are a ubiquitous part of modern life. Ongoing trends of mobile communication devices (e.g., radiotelephones) include decreasing size and increases in features and capabilities. Both trends are driven by the shrinking size and higher integration of electronics, particularly digital electronics. CMOS electronics, in particular, benefit from greater area utilization, lower power consumption, higher speed, and lower cost as CMOS technology migrates to ever-smaller feature size and higher integration.

Radio frequency (RF) circuits, on the other hand, which remain largely analog, have experienced no such dramatic improvements. Analog circuits thus consume an ever-increasing proportion of the circuit area and power of mobile communication devices, as digital circuits continue to shrink.

For RF transmitter design, the traditional quadrature transmitter architecture depicted in FIG. 20 remains the dominant design. The transmitter 100 includes signal processor 102 generating in-phase (I) and quadrature (Q) components of signals to be transmitted. Digital-to-Analog Converter 104 converts the digital signals to analog signals, using a reconstruction clock $f_s$ provided by a clock generator circuit 106. A Low Pass Filter 108 acts like a reconstruction filter and limits the analog signal bandwidth. The signals are modulated by a quadrature modulator 110, using quadrature clocks at the carrier frequency $f_{tx}$, provided by a clock driver circuit 112. A Variable Gain Amplifier 114 amplifies the modulated signal, and a Power Amplifier 116 boosts the signal to a power level sufficient at the output of the transmitter connected to an antenna 118.

The non-linearity in the components along the transmitter 100 chain can create harmonic distortions and inter-modulation products, which are unwanted frequency components leading to spurious emissions and interference to neighbor receivers or even its own receiver. To avoid this, the linearity requirements for the LPFs 108, quadrature modulator 110, and VGA 114 are very high, increasing the difficulty in design of these components, as well as their cost. On the other hand, high linearity normally implies high power consumption, as these analog components are usually operating in class A.

The traditional quadrature modulated transmitter 100 is deficient in several respects. Active and passive components, such as filter capacitors and large transistors for minimizing flicker noise, occupy a large silicon area, and the area will not shrink significantly with CMOS technology migration. Additionally, the analog design is sensitive to process variations, temperature and supply voltage changes, and the like, hence it is more sensitive to its environment and more difficult to design, e.g., in dealing with different process corners. Device matching is also a problem for deep submicron CMOS. Finally, power consumption is higher because better linearity and lower noise are required, which lead to high power.

To relax the design effort and reduce area and power consumption, an integrated digital quadrature modulator transmitter 120, depicted in FIG. 21, has been proposed by He, in the paper, "A 45 nm Low-power SAW-less WCDMA transmit Modulator Using Direct Quadrature Voltage Modulation," presented at the ISSCC, February 2009 in San Francisco, USA. The transmitter 120 features a digital quadrature modulator 122 that merges many components in a single digital block. VGA 124 sets the transmitter chain gain digitally by a multiplication operation. The original sample ratio of the baseband signal may be insufficient for digital-to-RF conversion stage DAC/QMOD, i.e., the quadrature modulator 130 which creates modulation spurious spectrum around the carrier clock frequency, thus the quadrature modulator 122 oversamples the signal, and uses interpolation circuits 126 to achieve the necessary bandwidth. The low pass filters 128 remove high frequency harmonics, and the combined DAC and quadrature modulator 130 generate an RF, quadrature modulated signal. Clock generator 106 and clock driver 112 provide carrier clock signals, which are modulated by the digital baseband signals and converted into modulated RF signals. Since the digital baseband signals have lower distortion than their analog counterparts, the linearity is improved. Additionally, area consumption may also be less than the analog components, due to the removal of large capacitors.

While it may address several shortcomings of the traditional design 100 of FIG. 20, the integrated digital quadrature modulator transmitter 120 of FIG. 21 also has several shortcomings. Although area efficiency is better than the transmitter 100, the power amplifier 116 remains as a separate circuit. The necessity of a separate modulator 122 and power amplifier 116, including the pads and interconnection, represents redundant area. Also, the power consumption is higher at the modulator 122 output, as it is normally required to drive 50 Ohm impedance at the output. The power efficiency in the modulator 122 and the power amplifier 116 is lower, due to the fact that they are normally operating linearly in class A, where the power consumption is constant. Thus, the design 120 has very low power efficiency at low output power levels. Furthermore, non-linear distortion in the power amplifier 116 is difficult to compensate, which creates interference at other radio frequencies. Finally, the system integration is not optimized, increasing the cost of the transmitter.

Regardless of the configuration or level of integration of the transmitter 100, 120 components, quadrature modulation has some basic deficiencies. In quadrature modulation, orthogonal signal components I and Q are used in the modulation which is very simple and straight-forward, as the baseband processor normally creates I and Q signals. Additionally, the I and Q channels may be balanced to reduce interference and disturbance in receiver band. However, a remaining issue in the power amplifier 116 is the efficiency dropping when I and Q channel outputs are combined together. With a Wilkinson power combiner, the efficiency drops 3 dB, and with an inductive load power combiner, when both I and Q conduct, the drain efficiency also drops. FIG. 22 depicts the results of a simulation showing that the efficiency drops most when amplitude of I equals that of Q, i.e., at 45 degree direction, when the I and Q channels most load each other.

A known alternative to quadrature modulation is polar modulation. In polar modulation, the amplitude signal m is $$m = \sqrt{I^2 + Q^2},$$

where $m \geq 0$ and the phase, or angle, signals is $$\theta = \arctan\left(\frac{Q}{I}\right)$$

where $0 \leq \theta \leq 2\pi$. The sinusoid functions at the angle $\theta$ are $$\sin(\theta) = \frac{Q}{m}$$

$$\cos(\theta) = \frac{I}{m}$$

Polar modulation does not suffer the same drop in efficiency near 45 degrees, as the amplitude and phase modulation paths are different, and do not load each other. However, the difference in the two paths introduces difficulties in matching them, which leads to different group delays. This introduces distortion, e.g., as measured by the error vector magnitude (EVM), which is the ratio of distortion to signal amplitude. Additionally, there is a large bandwidth expansion (e.g., on the order of five to nine times) in the conversion from Cartesian (I, Q) to polar (amplitude, phase) coordinates. The conversion is non-linear, with sharp edges when the signal is close to zero amplitude that require large bandwidth to reduce the distortion. This makes polar modulation unsuited for wideband applications, such as WCDMA.

A modulation technique that exhibited the consistent group delay and low bandwidth of quadrature modulation, with the consistent efficiency of polar modulation—and additionally would allow for an all-digital implementation, to take advantage of the speed and power benefits of CMOS technology evolution—would represent a significant advance in the state of the art of communication signal transmission.

SUMMARY

According to one or more embodiments disclosed and claimed herein, an affine transformation is applied to communication signals to be transmitted, that are expressed in I and Q components. The affine transformation divides the I, Q Cartesian coordinate space into a plurality of m radial sectors, defined by predetermined boundary angles. A signal falling within a sector is expressed as the vector sum of two radial vectors, each lying along the boundary angles of the sector.

A digital affine transformation modulator and power amplifier digitally prepares the signals for transmission, without an analog amplifier. The modulator performs an affine transformation on a signal. A power amplifier comprises a plurality of amplifier cells, each cell comprising at least two amplifier units. For a given signal, each amplifier unit selectively amplifies a clock signal having a phase corresponding to one of the boundary angles of the signal's affine transformed sector. A subset of the plurality of amplifier cells receiving phase clock signals are enabled, based on the magnitude of the associated vector describing the signal in affine transform space. In one embodiment, the magnitudes are converted from binary to thermometer coding, and each thermometer encoded bit selectively enables the associated amplifier unit in a respective amplifier cell. The outputs of the amplifier cells are connected together to form the digital power amplifier output. In one embodiment, the amplifier cells include impedance matching circuits to prevent variations in output impedance, and/or shut-down circuits to prevent RF leakage in disabled amplifier units. The amplifier units may be constructed as single-ended or differential arrangements of transistors.

In one embodiment, to enable rapid switching as a signal crosses affine transform sector boundaries, signal movement is predicted. A third, disabled, amplifier unit per amplifier cell receives a clock signal having a phase corresponding to the boundary angle of the predicted sector that is not shared by the current sector. The third amplifier units are selectively enabled, based on the magnitude of the associated vector in affine transform space, as the signal crosses into the predicted affine transform sector. At that time, the amplifier unit associated with the boundary angle of the previous sector that is not shared by the new (predicted) sector is disabled. This improves switching speed, and hence bandwidth, as signals rapidly move between affine transform sectors.

DETAILED DESCRIPTION

Figure 1:
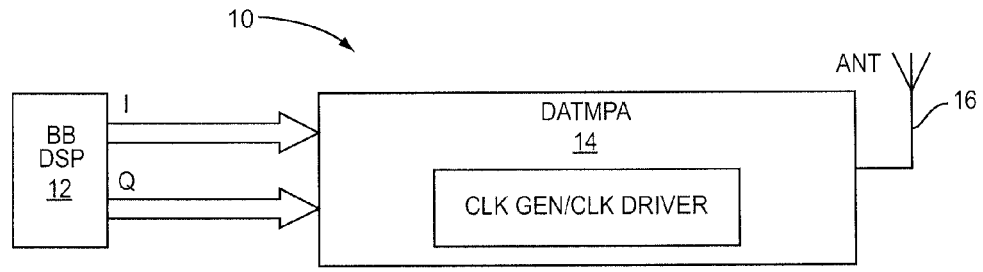
FIG. 1 is a functional block diagram of a digital affine transformation modulation transmitter (DATAM).

FIG. 1 depicts a digital affine transformation modulation (DATM) transmitter 10. The DATM transmitter 10 includes a baseband digital signal processor (BBDSP) 12 generating the in-phase (I) and quadrature (Q) components of signals to be transmitted. These digital, binary values are received by an integrated, digital affine transformation modulation power amplifier (DATMPA) 14 that merges the functions of digital-to-analog converter, low-pass filter, variable-gain amplifier, modulator, and power amplifier into one digital block. The DATMPA 14 also includes clock generator and clock driver circuits. The DATMPA 14 modulates the digital signals from the BBDSP 12 using affine transformation modulation scheme in the digital domain and amplifies the modulated signal in a digital power amplifier. The DATMPA 14 provides an amplified signal to an antenna 16 for transmission.

The DATM enables well-matched paths in the modulator, allowing for consistent group delay, and which are well suited for implementation by differential circuits to reduce noise and interference. The modulation paths are related to amplitude and phase, and hence do not suffer low efficiency when the I and Q components approach 45 degrees. However, the very wide bandwidth necessary for I/O conversion to polar is avoided. By implementing both the modulation and power amplification in the digital realm, the system takes full advantage of advances in CMOS technology to reduce silicon area and power consumption, increase speed, and achieve very high integration.

The affine transformation is described first, followed by the disclosure of several embodiments of a DATM transmitter 10. Switching speed as a signal moves is then considered, and embodiments of DATM transmitters 10 optimized for rapid switching are disclosed. Simulation results depict the efficiency of the DATMPA as a function of affine transform parameters.

An affine transformation between two vector spaces is defined as a full rank linear transformation given by a matrix A, that maps Cartesian coordinators i, q into an affine vector space of u, v using $$\begin{bmatrix} u \\ v \end{bmatrix} = \begin{bmatrix} a_{11}, a_{12} \\ a_{21}, a_{22} \end{bmatrix} \begin{bmatrix} i \\ q \end{bmatrix} + \begin{bmatrix} c_1 \\ c_2 \end{bmatrix} \quad (1)$$

The desired affine transformation should map the origin in i and q space to the origin in the affine space; accordingly, the translation coefficients $c_1$ and $c_2$ are set to zero. After mapping, the property of orthogonality will be lost unless the matrix A is an orthogonal matrix. In DATM, normally non-orthogonal bases are used. Since $c_1$ and $c_2$ both equal zero, the transformation is actually a linear one, which is a subset of affine transformations. To avoid confusion with linear and non-linear amplification or modulation, the term affine transformation is used herein.

Figure 2:
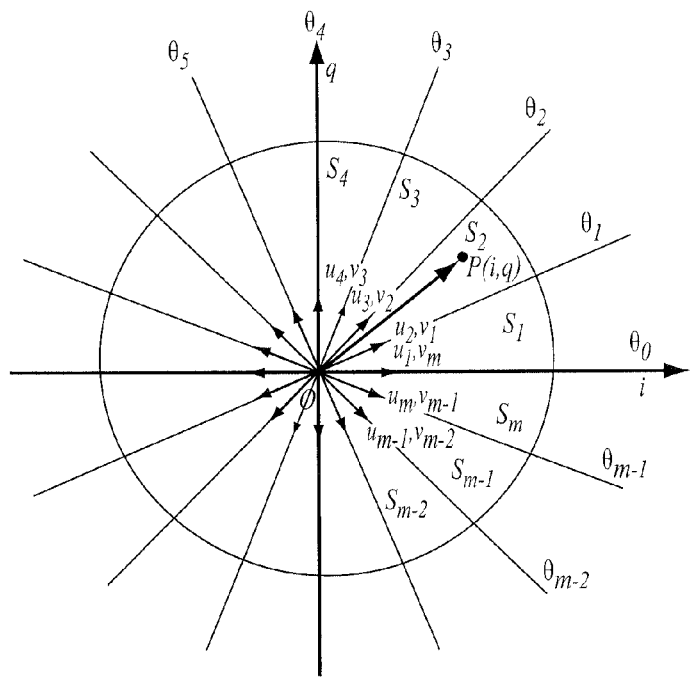
FIG. 2 is a polar graph depicting affine transform sectors.

In the affine transform, a cycle area in the i and q plane is divided into m equal sectors, $S_1, S_2, S_{m-1}, S_m$, by multiple predetermined boundary angles, $\theta = \{\theta_0, \theta_1, \theta_2, \ldots, \theta_{m-2}, \theta_{m-1}\}$, as depicted in FIG. 2. Here, m is an integer value, and the angles θ are selected to be easily implemented by varying the phase of digital clock signals.

A signal output in I and Q components, represented by a vector OP from the origin to point P(i,q) located in a sector, say $S_2$ in FIG. 2, is mapped into a sub-space by a linear matrix using the two boundary angles of the sector as vector bases, for instance, $\theta_1$, $\theta_2$ in FIG. 2. These boundary angles correspond to successive clock phases. The vector OP is represented in a sub-space $S_2$ by the vector sum $$U(\theta_1, \theta_2) = S_2 = S(u_2, v_2) = A_2(p(i,q)) = b_1 C_{\theta_1} + b_2 C_{\theta_2} \quad (2)$$

where $b_1$ and $b_2$ are magnitudes, greater than or equal to zero, and $C\theta_1$ and $C\theta_2$ are vectors with phase/angle of $\theta_1$ and $\theta_2$, respectively.

In general, for a signal output in I and Q components, represented by a vector OP from origin to point P(i,q) located in the sector j, the affine transformation in sub-space $S_j$ is $$U(\theta_{j-1}, \theta_j) = S_j = S(u_j, v_j) = A_j(p(i,q)) = b_{j-1} C_{\theta_{j-1}} + b_j C_{\theta_j} \quad (3)$$

where $b_j$ is a magnitude, greater than or equal zero, $C\theta_j$ is a vector with phase/angle of $\theta_j$, and j=0, 1, 2, ..., m−1.

For m different sectors, there are m different linear mappings, $A = \{A_1, A_2, \ldots, A_{m-2}, A_{m-1}, A_m\}$ that transform the I/O signal output (I.a, a succession of signals expressed in I and Q coordinates) into m affine linear spaces according to the signal trajectory in IQ space. An affine linear space, $S_j$ is created by an affine transformation, $A_j$ with two vector bases $u_j$ and $v_j$ corresponding to the boundary angles $\theta_j$, which are assumed to be only positive for ease in circuit implementation. Of course negative bases/boundary angles are also possible.

The affine transformation $A_j$ should be properly selected so that on all boundaries of the sectors, the affine transformations should keep the same trajectory when two vector components are combined, as the original I/O signals, and also guarantee the continuity of the mapped signals. If these conditions are met, then the mappings will not introduce any distortion.

Figure 3:
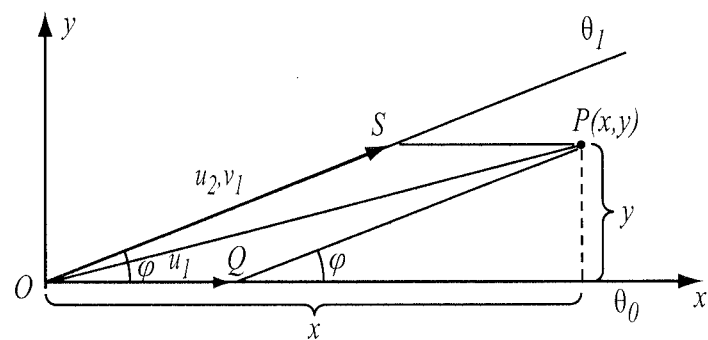
FIG. 3 is a diagram depicting vector addition.

FIG. 3 depicts the affine transformation for the first sector. The vector OP can be replaced by the sum of two vectors, OS and OQ, each of which has the same direction as the boundary angles $\theta_0$ and $\theta_1$. The affine transformation can be expressed as $$u_1 = SP = OQ = x - \frac{y}{\tan(\varphi)} \quad (4)$$

$$v_1 = OS = QP = \frac{y}{\sin(\varphi)}$$

Alternatively, equation (4) may be expressed in matrix form as $$\begin{bmatrix} u_1 \\ v_1 \end{bmatrix} = \begin{bmatrix} 1, & \frac{-1}{\tan(\varphi)} \\ 0, & \frac{1}{\sin(\varphi)} \end{bmatrix} \begin{bmatrix} x \\ y \end{bmatrix} = A_1 \begin{bmatrix} x \\ y \end{bmatrix} \quad (5)$$

For the other sectors, say sector k, k=1, ..., m−1, m, first a rotation operator, $R_k$, $$R_k = \begin{bmatrix} \cos(k-1)\varphi, & \sin(k-1)\varphi \\ -\sin(k-1)\varphi, & \cos(k-1)\varphi \end{bmatrix} \quad (6)$$

is used to map i and q into first x and y space, then the affine transformation is followed to map the x and y space into an affine space. Therefore the transformation can be written as a product of A1 and the rotation matrix $R_k$, $$\begin{bmatrix} u_k \\ v_k \end{bmatrix} = A_1 \begin{bmatrix} x \\ y \end{bmatrix} \quad (7)$$

$$= A_1 R_k \begin{bmatrix} i \\ q \end{bmatrix}$$

$$= A_k \begin{bmatrix} i \\ q \end{bmatrix}$$

$$= \begin{bmatrix} 1, & \dfrac{-1}{\tan(\varphi)} \\ 0, & \dfrac{1}{\sin(\varphi)} \end{bmatrix} \begin{bmatrix} \cos((k-1)\varphi), & \sin((k-1)\varphi) \\ -\sin((k-1)\varphi), & \cos((k-1)\varphi) \end{bmatrix} \begin{bmatrix} i \\ q \end{bmatrix}$$
(5)

where $A_k$ is a transformation that maps sector k into an affine space with boundary angles of $\theta_k$ and $\theta_{k+1}$.

Of course, i and q components may be separated into sign parts and value parts, and the signal rotated into the first quadrant. The affine transformation is then performed in the first quadrant, and the appropriate boundary angles determined. In this manner, the signals $u_k$ and $v_k$ will be positive.

For two successive sectors, $S_k$ and $S_{k+1}$, it can be seen from FIG. 2 or equation (5) that $v_k = u_{k+1}$, and this is required for maintaining continuity of the signal representation in mapped sub-spaces. In other words, even though two successive sectors use different affine transformations, at the boundaries the two transformations are connected continuously.

The integer parameter m, the number of sectors and hence the number of boundary angles (or clock phases), has impact on power efficiency. A larger m will provide higher power efficiency, up to the limit, as m approaches infinity, of the polar modulation method. Quadrature modulation can be viewed as a special case for m=4, and wherein the boundary angles are the I, Q axes.

In practice, values for m may be selected as 6, 8, 12, 16, 24, 32, etc. A larger value of m can help to reduce the size of a pre-distortion look-up table that is employed to cancel power amplifier non-linearity, as explained below. Assume that u and v are two vectors, with an angle φ in between, as $u_1$ and $v_1$ depicted in FIG. 3. The amplitude of OP, i.e., the sum of vectors u and v, is then $$|OP| = \sqrt{|u|^2 + |v|^2 + 2|u||v|\cos(\varphi)}$$
$$= \sqrt{|u|^2 + |v|^2 + 2|u||v|\cos\left(\dfrac{2\pi}{m}\right)}$$
(8)

As m increases, φ decreases. If φ is very small, then it is possible to use a 1-D pre-distortion table to cancel power amplifier non-linearity.

In a presently preferred embodiment, m=4*I, where I is a positive integer. If m=4*I, then the elements of the affine transformation matrix in the first quadrant will appear in other quadrants, reducing hardware complicity when a digital modulator implements the affine transformed signal.

Figure 4:
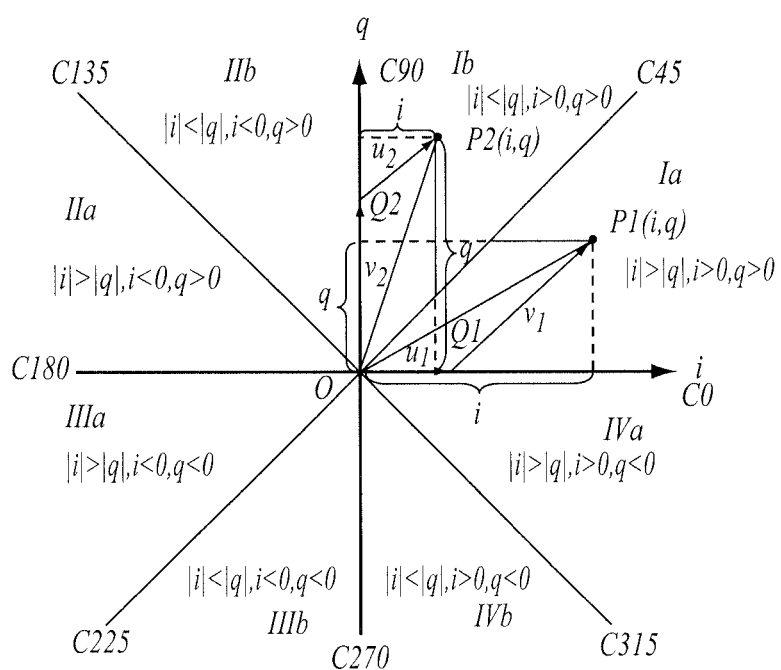
FIG. 4 is a polar graph depicting the vector sums of two signals in the first quadrant.

In one embodiment, depicted in FIG. 4, m=8, corresponding to eight boundary angles to define the sectors (and an eight-phase clock for a digital implementation). The sector boundary phases are C0, C45, C90, C135, C180, C225, C270 and C315. These phase angles divide the i and q plane into 8 sectors, Ia, Ib, IIa, IIb, IIIa, IIIb, Iva and IVb, which are easily obtained from the comparison of absolute values, and signs of the i and q signals.

For a point P1(i,q) in sector Ia, the affine transformation maps the point into an affine space U, based on two boundary angles C0 and C45, corresponding a clock phase at 0° and 45°. The vector OP1 can be expressed as a sum of two vectors, OQ1, and Q1P1. OQ1 has the same direction as i axis, and Q1P1 is a 45° clockwise rotated q axis. From FIG. 4, it is easy to see that $$OQ1 = u_1 = i - q$$

$$Q1P1 = v_1 = \sqrt{2}q$$

where $u_1$ and $v_1$ are vectors in the first affine sector laying along the boundary angles defining the sector.

Similarly, for a point P2(i,q) existing in sector Ib, the affine transformation maps the point into an affine space $U_2$ based on two boundary angles C45 and C90, corresponding a clock phase at 45° and 90°. The vector OP2 can be expressed also as a sum of two vectors, OQ2, and Q2P2. OQ2 has the same direction as q axis, and Q2P2 is a 45° counter-clockwise rotated i axis. From FIG. 4, it is easy to see that $$Q2P2 = u_2 = \sqrt{2}i$$

$$OQ2 = v_2 = q - i$$

Figure 5:
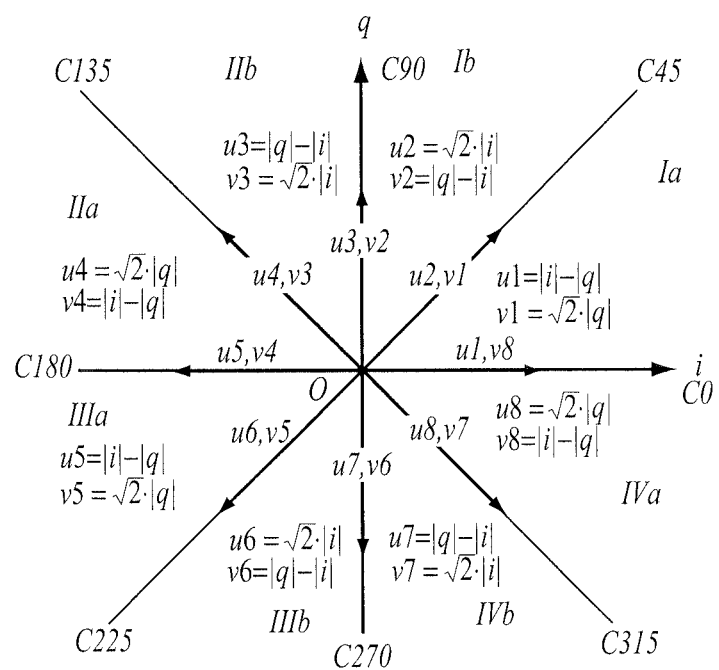
FIG. 5 is a polar graph depicting the sector boundaries and equations for an 8-sector affine transform system.

The rest of the mappings are determined similarly. The graph of FIG. 5 depicts all mappings, expressing the affine transformation of 8 sectors. The elements of the affine transformation matrix, expressed in 6 digits, are listed in Table 1, using absolute value for the variables i and q.

TABLE 1

Elements of Affine Transform Matrix for m = 8
Eight-sector Matrix $A_k$

| | $a_{11}$ | $a_{12}$ | $a_{21}$ | $a_{22}$ |
|---|---|---|---|---|
| k = 1 | 1.00000 | −1.00000 | 0.00000 | 1.41421 |
| k = 2 | 1.41421 | 0.00000 | −1.00000 | 1.00000 |
| k = 3 | −1.00000 | 1.00000 | 1.41421 | 0.00000 |
| k = 4 | 0.00000 | 1.41421 | 1.00000 | −1.00000 |
| k = 5 | 1.00000 | −1.00000 | 0.00000 | 1.41421 |
| k = 6 | 1.41421 | 0.00000 | −1.00000 | 1.00000 |
| k = 7 | −1.00000 | 1.00000 | 1.41421 | 0.00000 |
| k = 8 | 0.00000 | 1.41421 | 1.00000 | −1.00000 |

Figure 6:
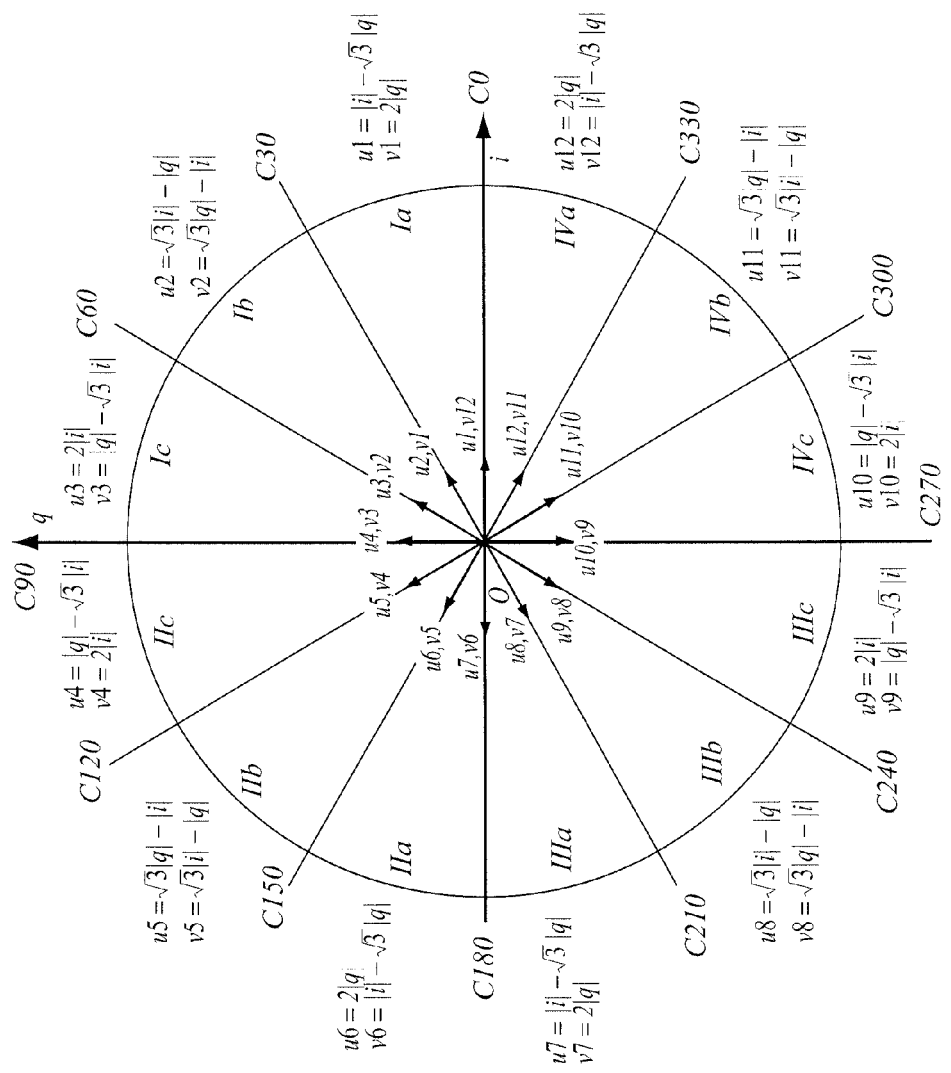
FIG. 6 is a polar graph depicting the sector boundaries and equations for a 12-sector affine transform system.

FIG. 6 depicts the mapping of an affine transformation for m=12, which are determined similarly. The elements of the affine transformation matrix, using the absolute value for the variables i and q, are listed in Table 2.

TABLE 2

Elements of Affine Transform Matrix for m = 12
12-sector Matrix $A_k$

| | $a_{11}$ | $a_{12}$ | $a_{21}$ | $a_{22}$ |
|---|---|---|---|---|
| k = 1 | 1.00000 | −1.73205 | 0.00000 | 2.00000 |
| k = 2 | 1.73205 | −1.00000 | −1.00000 | 1.73205 |
| k = 3 | 2.00000 | 0.00000 | −1.73205 | 1.00000 |
| k = 4 | −1.73205 | 1.00000 | 2.00000 | 0.00000 |
| k = 5 | −1.00000 | 1.73205 | 1.73205 | −1.00000 |
| k = 6 | 0.00000 | 2.00000 | 1.00000 | −1.73205 |
| k = 7 | 1.00000 | −1.73205 | 0.00000 | 2.00000 |
| k = 8 | 1.73205 | −1.00000 | −1.00000 | 1.73205 |
| k = 9 | 2.00000 | 0.00000 | −1.73205 | 1.00000 |
| k = 10 | −1.73205 | 1.00000 | 2.00000 | 0.00000 |
| k = 11 | −1.00000 | 1.73205 | 1.73205 | −1.00000 |
| k = 12 | 0.00000 | 2.00000 | 1.00000 | −1.73205 |

Development of the affine transformation equations and elements of the affine transform matrix may be similarly derived for larger values of m.

Expressing an affine transformed signal as the sum of two vectors, each having, in general, a different magnitude and the angle of one of the boundary angles defining the affine transform sector, allows for an implementation of a digital affine transformation modulator and/or a digital power amplifier to be able to provide an RF signal directly to a transmit antenna, without an analog amplifier.

Figure 7:
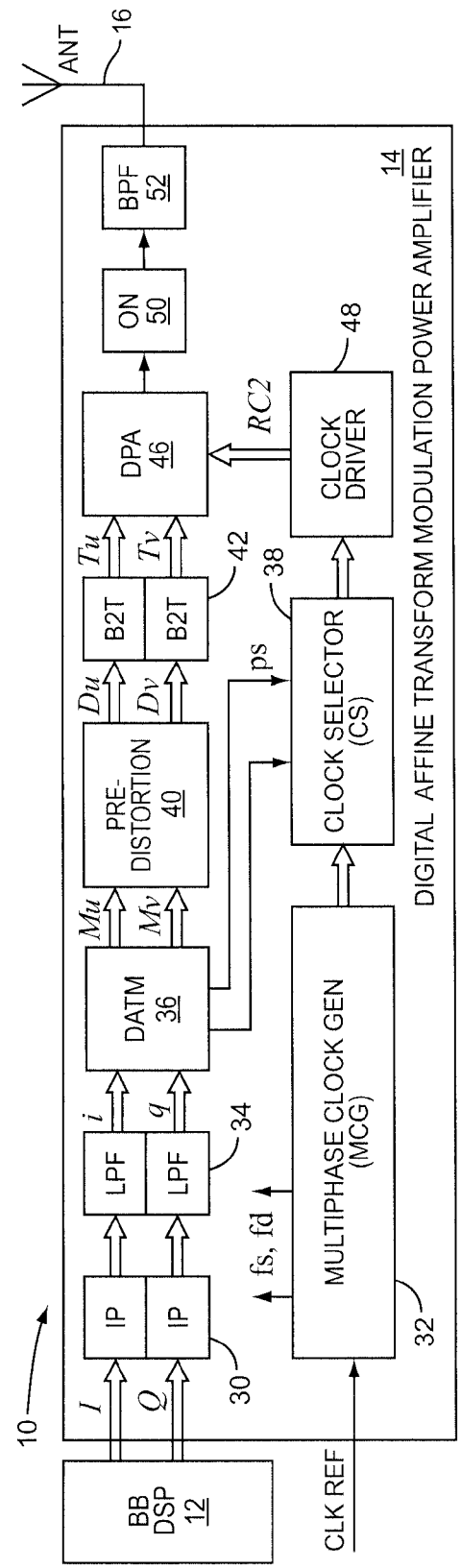
FIG. 7 is a functional block diagram of a cold-switched DATAM.

FIG. 7 depicts one embodiment of a transmitter 10. The transmitter includes a baseband Digital Signal Processor 12, digital affine transformation modulation power amplifier (DATMPA) 14, and antenna 16. The BBDSP 12 generates digital modulation signals (digital baseband signals) expressed as I and Q components. The I and Q signal components are received and processed in parallel chains in the DATMPA 14. For reasons explained below, this embodiment of the DATMPA 14 is referred to as a "cold switched" design. The signal processing chains include, for each channel, an interpolator 30 and low pass filter 34, digital affine transformation modulator (DATM) 36, pre-distortion module 40, binary-to-thermometer coding module 42, digital power amplifier 46, output network 50, and band pass filter 52.

The interpolators 30 over-sample the baseband digital signals, and digital low pass filters 34 remove out-of-band spurious components due to the sampling. The IPs 30 and LPFs 34 receive appropriate clock signals from a multiphase clock generating circuit 32.

The sampled and filtered i and q signals are passed to a digital affine transformation modulator (DATM) 36, which transforms the signals to affine transform space as described above, comprising two vectors, each having a magnitude and a direction corresponding to a boundary angle of an affine transform sector. The DATM 36 outputs the magnitudes of these two vectors as the digital values Mu and Mv. The DATM 36 additionally outputs the corresponding vector direction information (phase control signal ps) to a clock selector circuit 38.

The clock selector circuit 38 selects clock signals having phases corresponding to the boundary angles of the sectors into which the DATM 36 maps the signals. Any clock with arbitrary phase shift of φ can be created with the following equation:

$$\sin(\omega t + \phi) = \sin(\omega t)\cos(\phi) + \cos(\omega t)\sin(\phi) \quad (9)$$

That is, the sum of quadrature clocks with fixed weight or programmable factors of cos(φ) and sin(φ). In one embodiment, the multiphase clock generating circuit 32 creates several clock phases (e.g., corresponding to all of the boundary angles defining the affine transform sectors). The clock selector circuit 38 then selects required clock signals from the output of multiphase clock generating circuit 32 based on the phase control signals ps that are generated from the DATM 36, and the selected phase clock signals are sent to the clock driver module 48, which provides them to the digital amplifier 46.

Pre-distortion modules 40 apply corrections to the magnitude signals Mu and Mv that compensate for certain non-linear distortion introduced by the downstream digital power amplifier 46, outputting pre-distorted affine transform vectors Du and Dv. In one embodiment, the pre-distortion unit 40 operates by use of a look-up table.

The pre-distorted affine transform vectors Du and Dv are then transformed into a thermometer coding in binary-to-thermometer coding modules 42, which output the values Tu and Tv. As known in the art, the thermometer coding of an n-bit binary representation of a value x is a value comprising $2^n$ bits, wherein all lower bit positions up to the $x^{th}$ bit are 1, and bit positions above the $x^{th}$ bit are 0.

The digital power amplifier 46 amplifies the selected phase clock signals according to the magnitudes of the vectors aligned along corresponding affine transform sector boundary angles, which sum to the signal within that sector. The structure and operation of the digital power amplifier 46 is described in greater detail herein.

The digitally amplified RF signal is matched in impedance by an output matching network 50. A band pass filter 52 removes spurious signal components outside the transmitter 10 band. The filtered RF output signal is then coupled to an antenna 16 for transmission.

Figure 8:
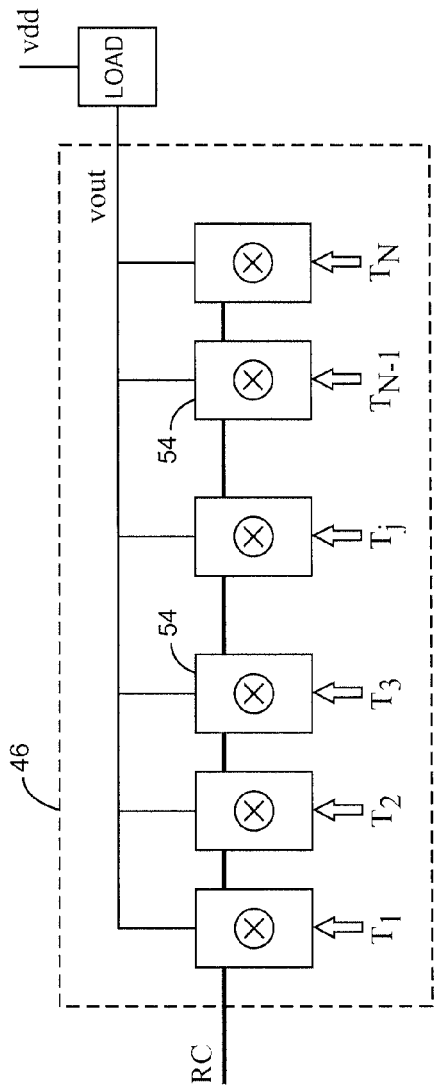
FIG. 8 is a functional block diagram of a single-ended digital power amplifier for a DATAM.
Figure 9:
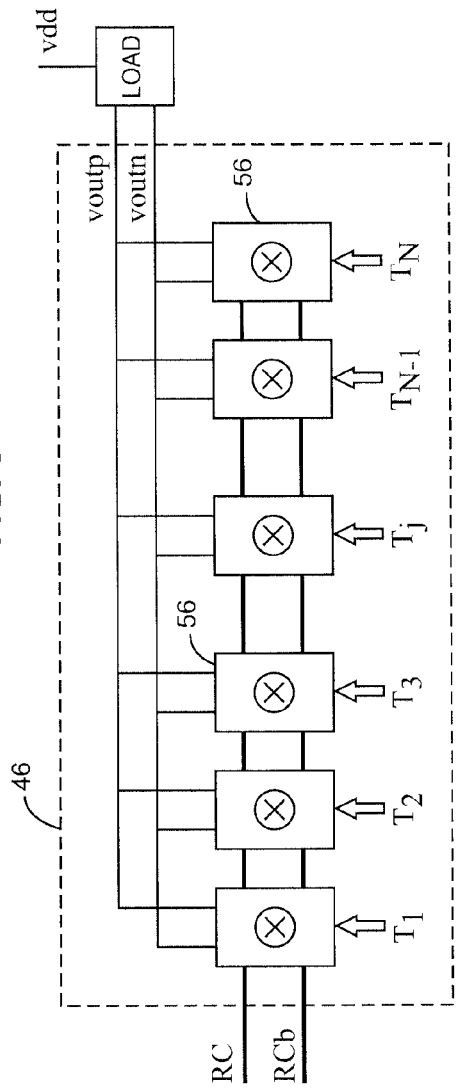
FIG. 9 is a functional block diagram of a differential digital power amplifier for a DATAM.

FIG. 8 depicts the structure of the digital power amplifier 46 implemented in a single-ended design, comprising N parallel amplifier cells 54. FIG. 9 depicts the amplifier 46 in a differential, or balanced design, comprising N parallel differential amplifier cells 56. In either case, each cell 54, 56 receives corresponding bits of an input vector $T_j$, j=1, 2, ..., N, and a clock signal input vector RC. The cells 56 of the differential design of FIG. 9 also receive a complimentary clock signal vector RCb. $T_j$ is a thermometer coded data bus comprising, for each amplifier cell 54, 56, the bits $[Tu_j, Tv_j]$. Similarly, the clock signal input vector RC includes two phase clock signals, Ru and Rv. The amplifier cell 54, 56 outputs are connected together, and applied to a load.

Summing the outputs of N parallel amplifier cells 54, 56 implements a multiplication operation that can be expressed as:

$$Yse = Tx \cdot Rz \quad \text{for single-ended} \quad (10)$$
$$= \sum_{k=1}^{N} (Tx_k \cdot Rz),$$

$$Ydiff = Tx \cdot Rzp - Tx \cdot Rzn \quad \text{for differential}$$
$$= \sum_{k=1}^{N} (T_k \cdot Rzp - T_k \cdot Rzn),$$

where Tx is a modulation signal, derived from the magnitudes of the affine transform vectors, and Rz is phase clock signals (Ru,Rv). Rzp and Rzn are differential phase clock signals. In this manner, a multiplication operator can be realized by summing a plurality of weighted branches of logic operator AND. This summing operation can be implemented by merging the currents of the weighted branches at a linear load.

This can be applied to a modulator which has an operation as:

$$Ose = Tu \cdot Ru + Tv \cdot Rv \quad \text{for single-ended} \quad (11)$$
$$= \sum_{k=1}^{N} (Tu_k \cdot Ru + Tv_k \cdot Rv),$$

$$Odiff = Tu \cdot Rup - Tu \cdot Run + Tv \cdot Rvp - Tv \cdot Rvn \quad \text{for differential}$$
$$= \sum_{k=1}^{N} (Tu_k \cdot Rup - Tu_k \cdot Run + Tv_k \cdot Rvp - Tv_k \cdot Rvn),$$

Figure 10:
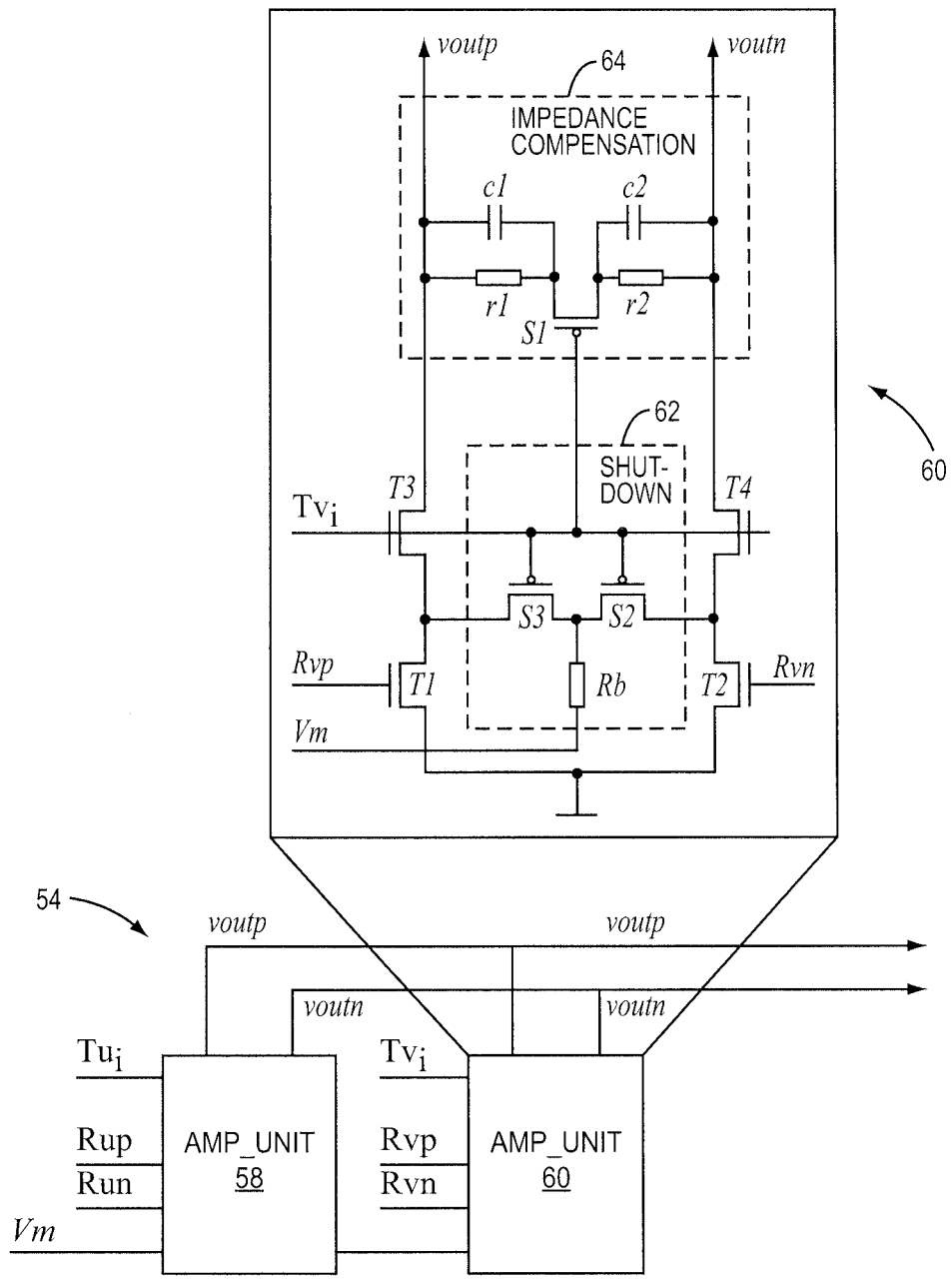
FIG. 10 is a functional circuit diagram depicting an amplifier unit of a cold-switched, differential digital power amplifier for a DATAM.

FIG. 10 depicts an implementation of the operations expressed in the brackets of equation (11) for the differential case. FIG. 10 depicts a single amplifier cell 56, comprising two amplifier units 58, 60. A first amplifier unit 58 receives the $i^{th}$ bit of the modulation signal Tu (derived from the magnitude of the vector along boundary angle u in the affine transform space) and differential clock signals Rup, Run, having a phase corresponding to the boundary angle u. The second amplifier unit 60 receives the $i^{th}$ bit of the modulation signal Tv and differential clock signals Rvp, Rvn, corresponding to the vector along boundary angle v.

A functional circuit diagram of the amplifier unit 60 is depicted in FIG. 10. Transistors T1 and T2 are connected to the complementary clock signals Rvp, Rvn, and transistors T3 and T4 are controlled by the digital logic $Tv_i$, performing the operation in equation (11). voutp and voutn are output nodes. The common source configured transistors T1 and T2 provide high frequency trans-conductance, gm, and the common gate configured transistors T3 and T4 provide high voltage output. Normally T3 and T4 are built with think oxide LDMOS transistors to achieve high break-down voltage, and as they are working in common gate configuration, the cut-off frequency is much higher. This common-source and common-gate structure is more suitable for the power amplifier 46 stages. The differential output also provides two benefits: first, it has twice the output amplitude of a single-ended output, and second, all even-order harmonics and inter-modulation products will be canceled, reducing spurious emissions.

In some embodiments, addition to the two RF transistor branches implemented with T1-T4, the amplifier unit 60 includes one or both of an impedance compensation circuit 64 and a shut-down circuit 62. Switching transistors T1-T4 changes the output impedance, and will give rise to phase changes based on which transistors are switched in or out (based on the value of T) over all of the amplifier cells 54, 56. The PMOS transistors S1 in the impedance compensation circuit 64 will conduct when the $Tv_i$ signal is logic low. Conducting of S1 makes the cell output impedance unchanged in both enabled and disabled states.

The shut-down circuit 62 eliminates clock leakage. When $Tv_i$ is logic low, T3 and T4 are off. However, RF signal couples through T3, T4 to reach voutn, voutp as leakage. Within the shut-down circuit 62, PMOS transistors S2 and S3 conduct when the amplifier unit 60 is disabled. This connects the floating nodes at the drains of the RF transistors T1 and T2 to a bias voltage Vm, which provides a weak DC current leakage to the drains and maintains a certain voltage potential close to the operating voltage when it is enabled. This arrangement reduces the switching disturbance caused by charge and discharge during the transitions from enabled to disabled, and vice versa. Of course, in other embodiments, the switch devices S1-S3 can be replaced with NMOS transistors and driven by inversed logic. Also, other common gate configured NMOS transistors can be inserted between the drains of NMOS transistors T3 and output node voutp, and T4 and output node voutn, to relax the break-down requirements for T3 and T4.

Figure 11:
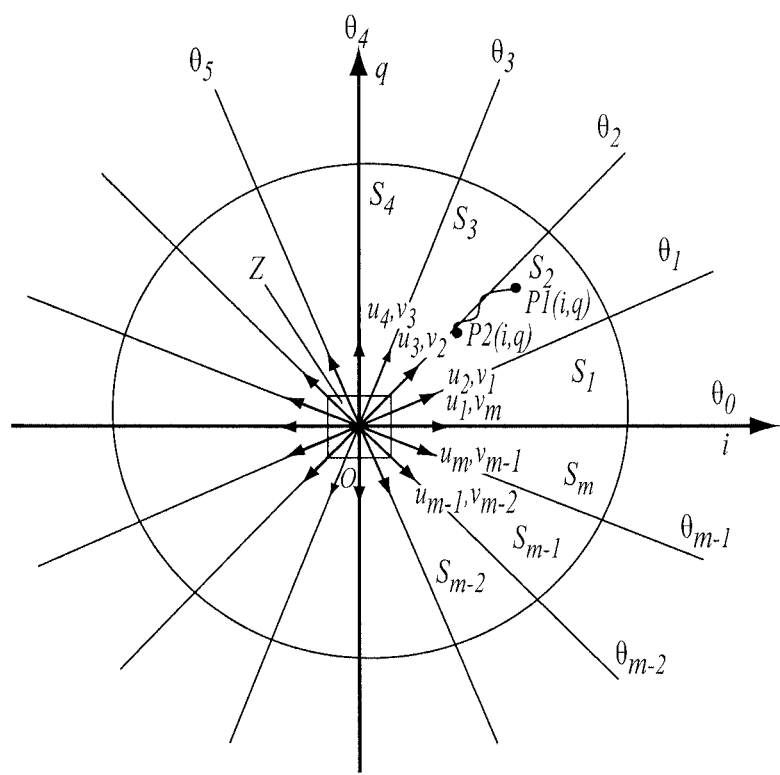
FIG. 11 is a polar graph depicting sector boundaries and the movement of a signal between sectors.

FIG. 11 depicts a scenario where an I/O signal trajectory—that is, a sequence of digital baseband signals generated by the BBDSP 12 in I and Q component form—travels from P1 to P2, moving back and forth cross a boundary angle. In the case depicted, the boundary angle is 45°. Obviously, $\theta_2$ must be selected as one clock phase supplied to the amplifier cells 54, 56 of the digital power amplifier 46. However, the other clock phase should at times be $\theta_3$, and at other times $\theta_1$, depending whether the signal is in sector $S_3$ or $S_2$, respectively. At high speed, using one affine transformation may have a timing problem in implementation, in that the clock selector circuit 38 is not fast enough to switch clock phases, in response to the DATM 36, as the signal is mapped to different (adjacent) affine transform sectors.

Figure 12:
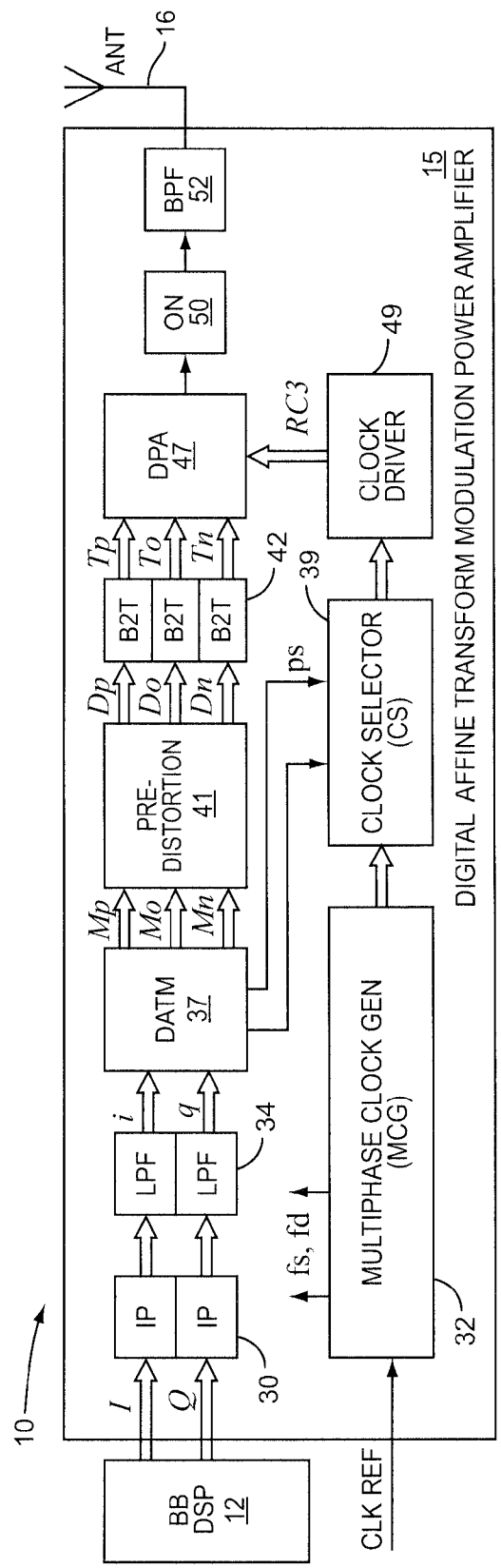
FIG. 12 is a functional block diagram of a hot-switched DATAM.

FIG. 12 depicts an embodiment of a transmitter 10 including a "hot-switched" DATMPA 15. Circuit modules corresponding to the cold-switched embodiment of FIG. 7 function similarly, and are numbered the same. In the hot-switched embodiment, the DATM 37, pre-distortion module 41, and digital power amplifier 47 have three parallel digital processing paths rather than two. The clock selector 39 and clock driver modules 49 select and drive, respectively, three clock phases. The binary-to-thermometer coding modules 42 function as described above; however, there are three of them in the hot-switched DATMPA 15.

The hot-switched DATM 37 maps a signal to digital affine transform space, and outputs the magnitude and angles of vectors lying along an affine transform sector boundaries, that sum to the signal, as described above. In addition, the DATM 37 predicts a signal's trajectory in affine transform space, and calculates and outputs the magnitude and angle of a third vector. The third vector lies along the boundary angle of a predicted (adjacent) sector that is not a boundary of the current sector. For example, referring to FIG. 11, at and near the signal S2, the DATM 37 would output vectors along boundary angles $\theta_1$ and $\theta_2$. In addition, the DATM 37 would output a third vector lying along boundary angle $\theta_2$, as it predicts the signal may move into affine transform sector $S_3$.

Figure 13:
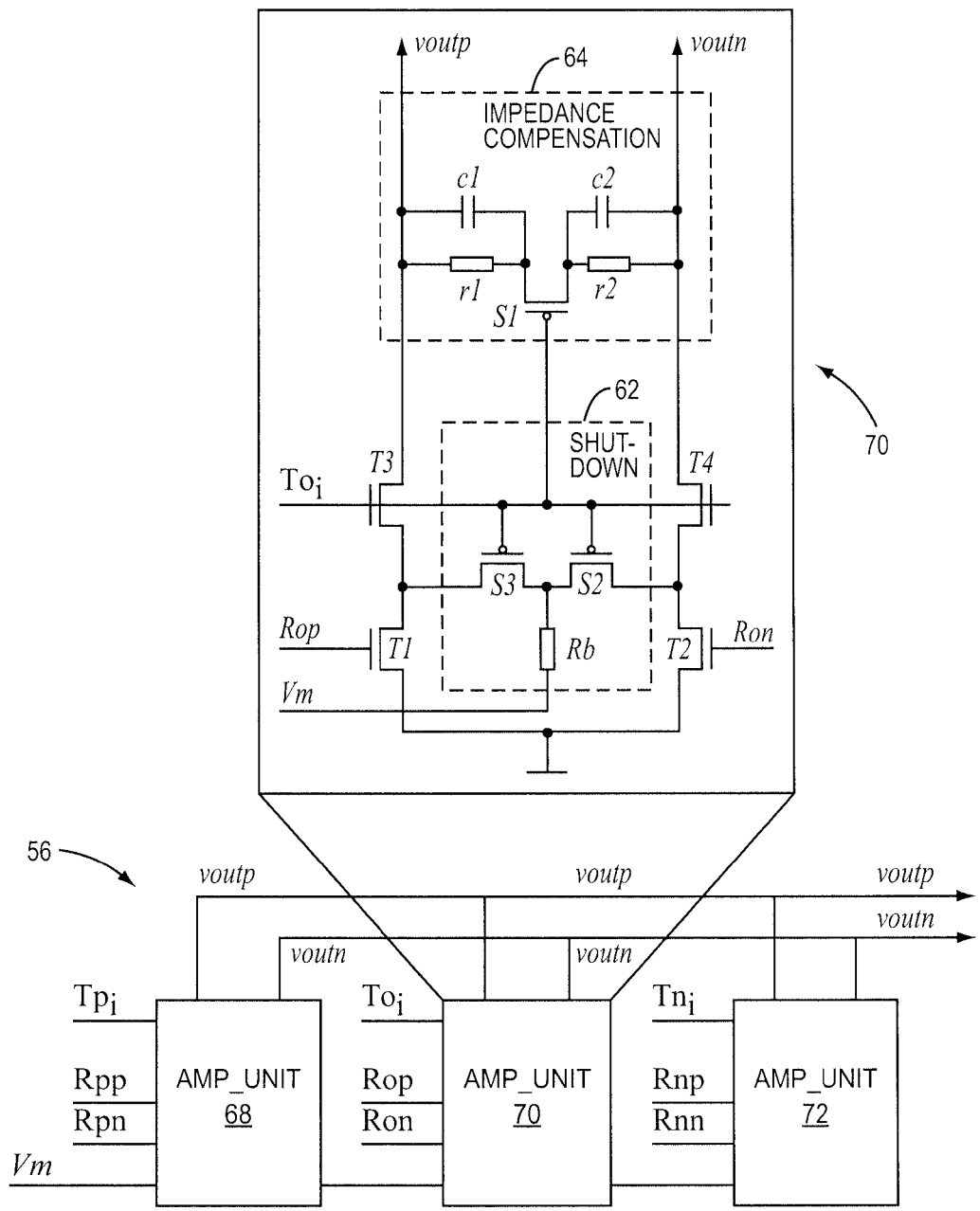
FIG. 13 is a functional circuit diagram depicting an amplifier unit of a hot-switched, differential digital power amplifier for a DATAM.

FIG. 13 depicts an amplifier cell 56 of the hot-switched digital power amplifier 47. The amplifier cell 56 includes three differential amplifier units 68, 70, 72, each receiving the $i^{th}$ bit of a thermometer coded magnitude of a respective vector, and the corresponding phase clock signals. At any given time, one of the three amplifier units 68, 70, 72—corresponding to the "other" boundary angle of the predicted affine transform sector—is disabled across all amplifier cells 56 of the digital power amplifier 47 (that is, the $T_j$ value is all 0's). Meanwhile, the other two amplifier units 68, 70, 72 are selectively enabled based on their respective $T_j$ value, as described above with respect to the cold-switched embodiment. As the signal crosses into an adjacent affine transform sector, the disabled amplifier units 68, 70, 72 becomes active, and one of the other two (corresponding to the "other" boundary angle of the prior sector) is disabled across all amplifier cells 56 of the digital power amplifier 47. In this manner, the digital power amplifier 47 is able to rapidly switch between boundary angles, as a signal moves between affine transform sectors. FIG. 13 depicts one embodiment of the transistor circuits of amplifier unit 70 (representative of all amplifier units 68, 70, 72), which functions as described above.

Figure 14:
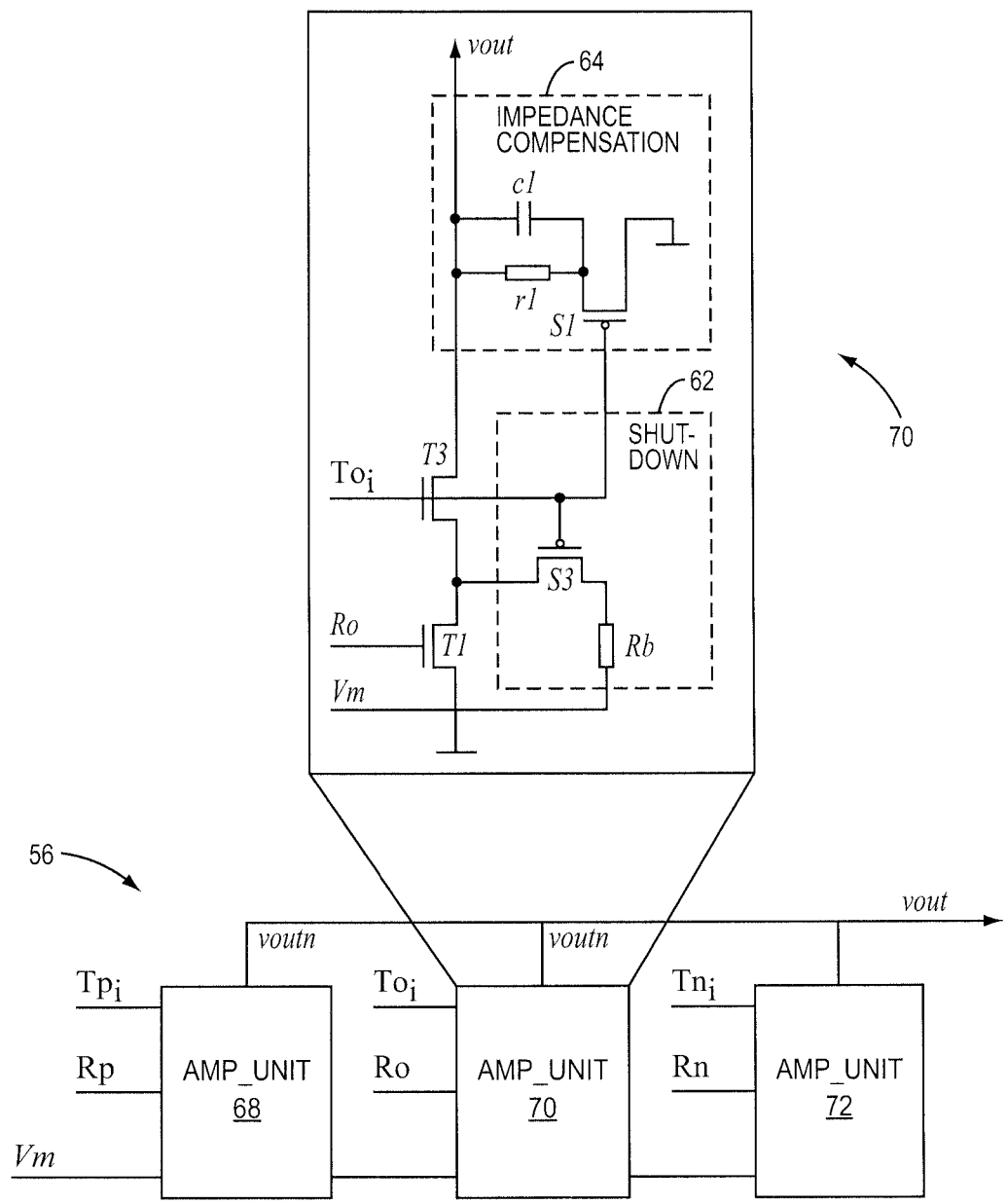
FIG. 14 is a functional circuit diagram depicting an amplifier unit of a hot-switched, single-ended digital power amplifier for a DATAM.

FIG. 14 depicts an amplifier cell 54 of the hot-switched digital power amplifier 47 comprising three single-ended amplifier units 68, 70, 72. Note that an amplifier cell 54 of a cold-switched digital power amplifier 46 would have the same transistor structure, but would comprise only two of the amplifier units 68, 70, 72.

Figure 15:
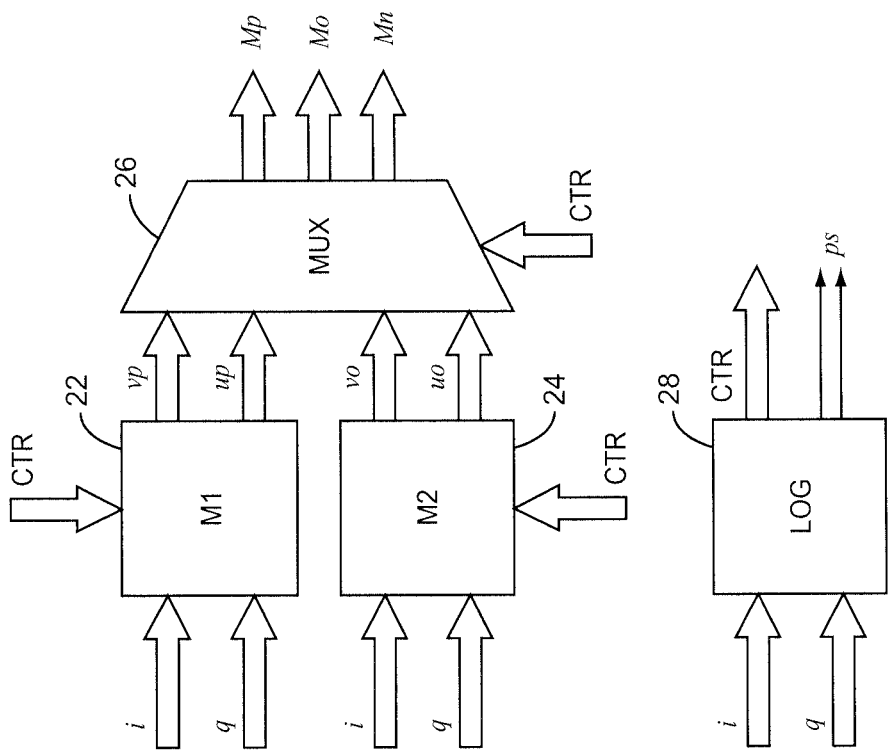
FIG. 15 is a functional block diagram of a circuit implementing an affine transformation modulation.

FIG. 15 depicts an exemplary functional structure for a hot-switched DATM 37. The DATM 37 includes two matrix operators M1 22 and M2 24, a multiplexer 26, and a digital logic block 28 that generates control signals CTR and clock phase selection signal ps.

Figure 16:
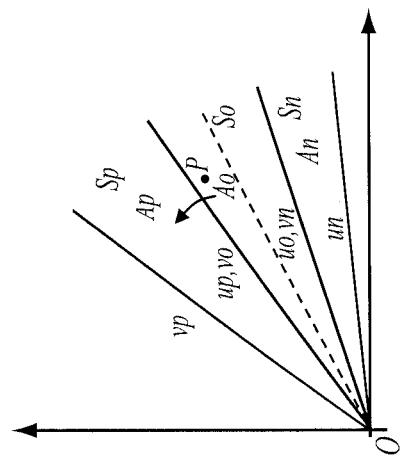
FIG. 16 is a graph depicting signal movement across sectors.

FIG. 16 depicts a signal P(i,q) currently located in a sector So corresponding to an affine transformation Ao which creates outputs uo and vo. The affine transformation Ao is assigned to matrix operator M1 22. Comparing the amplitudes of the output vectors uo and vo, if |vo|>|uo|, then M2 will load affine transformation Ap as its operation parameters, otherwise, M2 will load An. Thus Ao is the currently active affine transformation, and Ap is an alternative, ready to be hot-switched. If the signal actually crosses into the sector Sp, then M2=Ap, and M1 is released for an alternative, ready to be hot-switched.

Based on the current input signals i(t) and q(t), as well as the next input signals i(t+1) and q(t+1), the Log module 28 provides all required control signals CTR for matrix parameter updating, and phase selection signal ps for clock phase signals updating.

Figure 17:
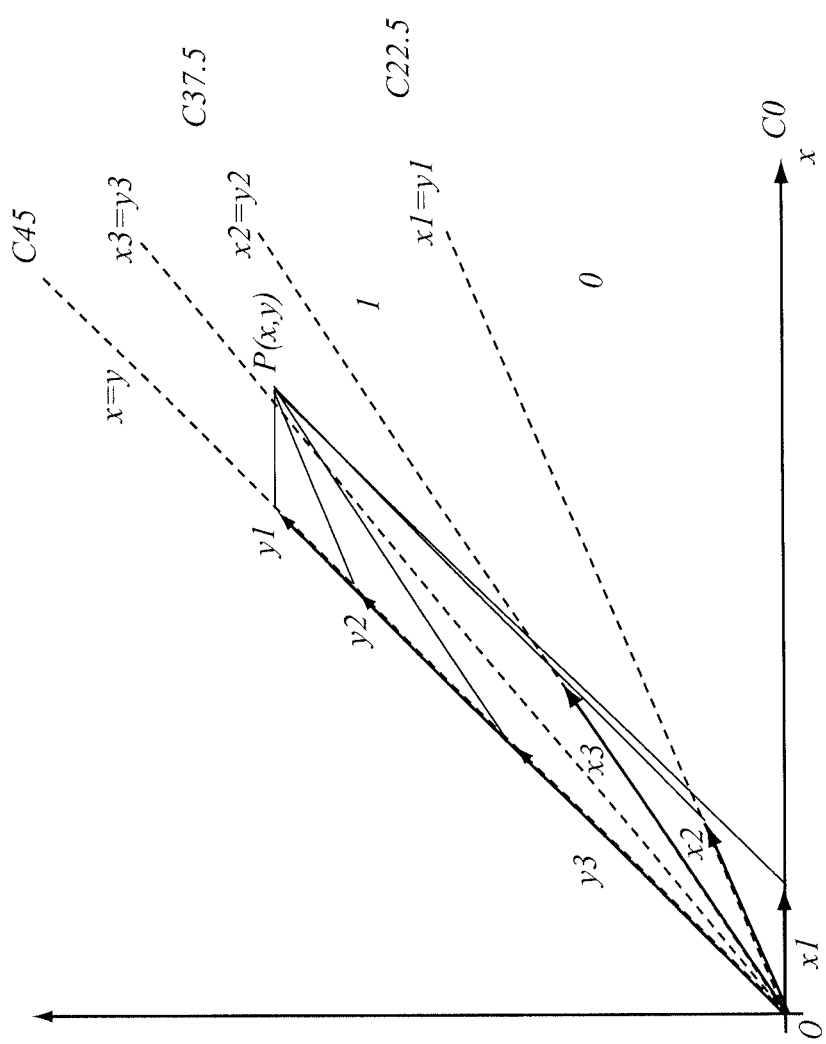
FIG. 17 is a diagram depicting vector addition and the tracking of a signal as it moves through a sector.

In one embodiment of the Log module 28, an algorithm determines the sector number of a given signal, where the number of sectors $m=2^b$, and b is an integer. The algorithm uses a finite number of iterations of an operation that projects the current components into a half-sector, and assigns the b bits of a binary value. The algorithm is described with reference to FIG. 17, where the notation CX refers to a clock with X degrees of phase offset.

Assume that m=64, thus b=6. A given point P(x,y) is located in the first quadrant, and the first two bits are assigned the values 0,0. The coordinates x and y are compared. Since here, x<y, the next bit is assigned the value 0, and P(x,y) is projected between clock phases C45 and C0, and results in x1 and y1. As y1>x1, the next bit is assigned the value 0 and P(x,y) is projected between clock phases C45 and C22.5, resulting in x2 and y2. As y2>x2, then the next bit is assigned the value 1 and P(x,y) is projected between clock phases C45 and C37.5, and results in x3 and y3. As x3<y3, then the next bit is assigned the value 1 and the algorithm terminates. Accordingly, the sector number is found as (000110) in a binary format.

Another method to determine the sector number for a given point P(x,y) located in the first quadrant, is to calculate the ratio of y/x, so $$\text{sector}\left(\frac{y}{x}\right) = k, \text{ if } \tan((k-1)\varphi) < \frac{y}{x} < \tan((k-1)\varphi) \quad (12)$$

or $$\text{sector}\left(\frac{y}{x}\right) = k, \text{ if } \tan((k-1)\varphi) \cdot x < y < \tan((k-1)\varphi) \cdot x$$

Then P(x,y) is fallen into the k-th sector, here $0 \leq k \leq I-1$, and I=m/4.

In general, for a given point P(x,y), existing in quadrant K the sector number ks can be found by $$\text{If } K = 1, \text{ sector}\left(\frac{y}{x}\right) = k, \quad (13)$$

if $\tan((k-1)\varphi) \cdot x < y < \tan((k-1)\varphi) \cdot x$ $$\text{If } K = 2, \text{ sector}\left(\frac{|x|}{y}\right) = k,$$

if $\tan((k-1)\varphi) \cdot y < |x| < \tan((k-1)\varphi) \cdot y$ $$\text{If } K = 3, \text{ sector}\left(\frac{|y|}{|x|}\right) = k,$$

if $\tan((k-1)\varphi) \cdot |x| < |y| < \tan((k-1)\varphi) \cdot |x|$ $$\text{If } K = 4, \text{ sector}\left(\frac{x}{|y|}\right) = k,$$

if $\tan((k-1)\varphi) \cdot |y| < x < \tan((k-1)\varphi) \cdot |y|$ finally: $ks = (K-1) \cdot I + k$ That is, take the absolute value of the input variables x and y, and swap them according to their location judged from the sign of the variables. Then make I comparisons and count the sector number. The comparisons can be implemented in paralleled structure to increase the speed.

Referring again to FIG. 11, note that for signals close to the origin, all sectors are closely spaced, and even small signal movement will trigger rapid sector boundary crossing, implying high speed switching in the DATMPA 14, 15. To reduce the speed requirement for the circuits, a region covering the origin can be defined, such as the squared Z region. In general, the Z region can take any shape, so long as its boundaries may be readily determined. Inside the Z region, m becomes MS, and outside the Z region, m becomes ML, here ML>MS, and ML and MS are positive integers. When MS=4, then the region Z becomes z-square, and in this case quadrature modulation may be applied within the Z region, and affine transform is applied outside of the Z region. In general, MS can take any other integer value.

The z-square region has very simple boundaries, so that $$P(i,q) \subset Z, \text{ if } (|i|<z \text{ and } |q|<z)$$

$$P(i,q) \subset S, \text{ otherwise} \quad (14)$$

Here z is a small positive number that defines the boundary of squared Z region, and S is the region of whole (i,q) plane excluding Z. So inside region Z, the mapping is $$\begin{bmatrix} uz \\ vz \end{bmatrix} = \begin{bmatrix} 1, & 0 \\ 0, & 1 \end{bmatrix} \begin{bmatrix} i \\ q \end{bmatrix} \quad (15)$$

And outside Z, the affine transformation defined in equation (7) is applied.

In one embodiment, the region Z may be further split into two or more regions, wherein a signal is mapped onto different numbers of sectors. As one example, the region Z may assume a hierarchical structure having progressively fewer sectors closer to the origin. Those of skill in the art may readily determine the number of sectors, and the distance from the origin at which to place the transitions, for any given implementation, given the teachings of the present disclosure.

Figure 18:
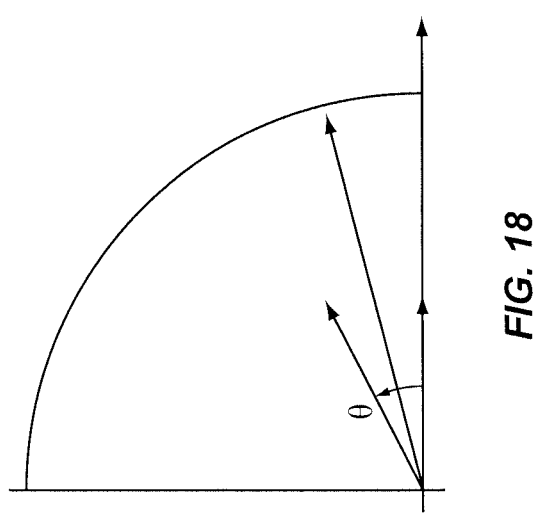
FIG. 18 is a graph of two constant-magnitude vectors separate by an angle $\theta$.

The power and efficiency of the DATMPA 14, 15 is explored, with reference to FIG. 18. Assume two vectors, having the same amplitude and an angle θ between them, are summed. While the amplitude of the combined vectors is maintained constant, the angle θ changes from 0 to 90°. A simulation was performed, based on these signals, to illustrate the power efficiency of a digital power amplifier 46 as a function of the angle θ.

Figure 19:
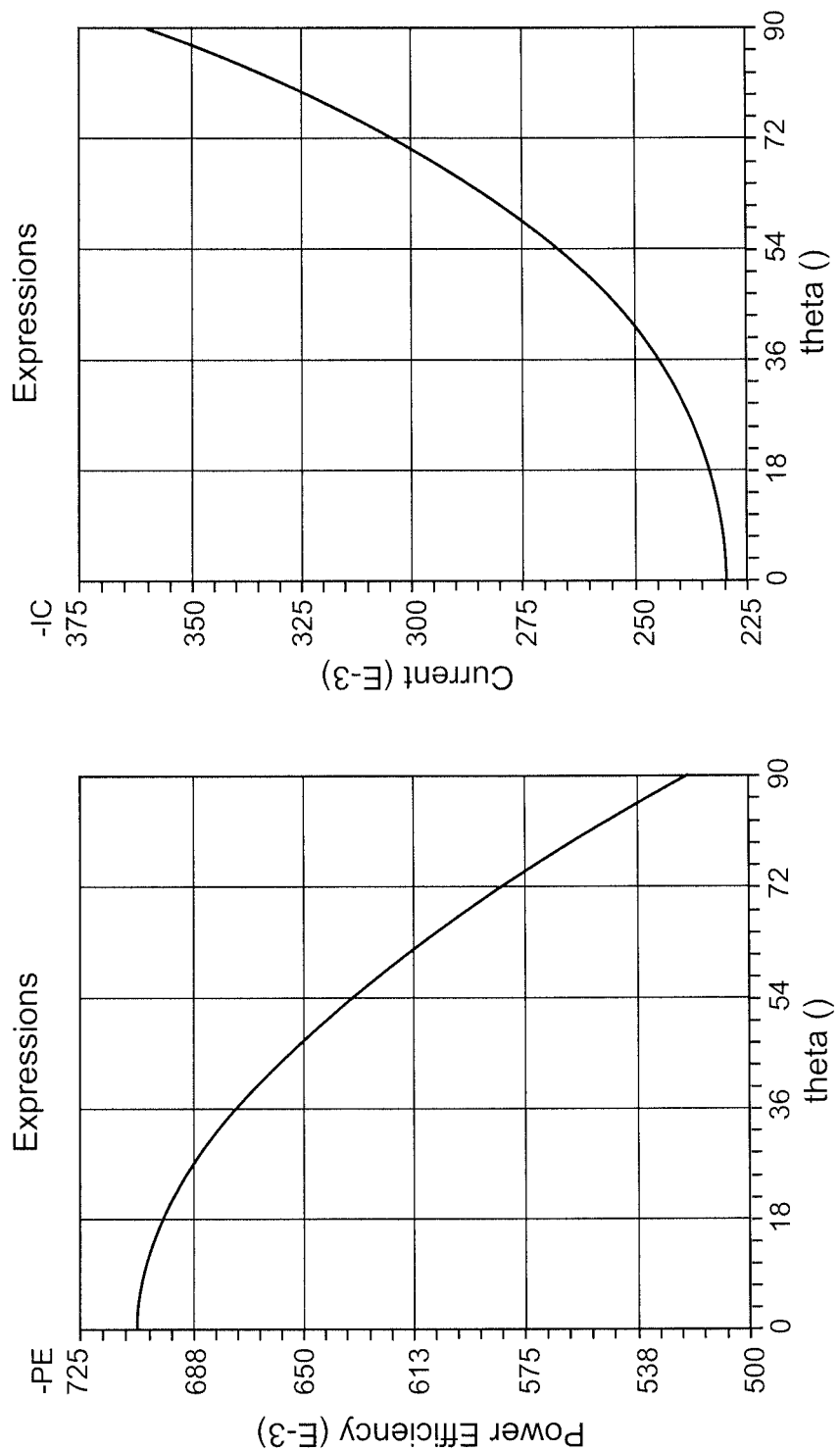
FIG. 19 are graphs depicting the power efficiency and current of a DATAM.
Figure 20:
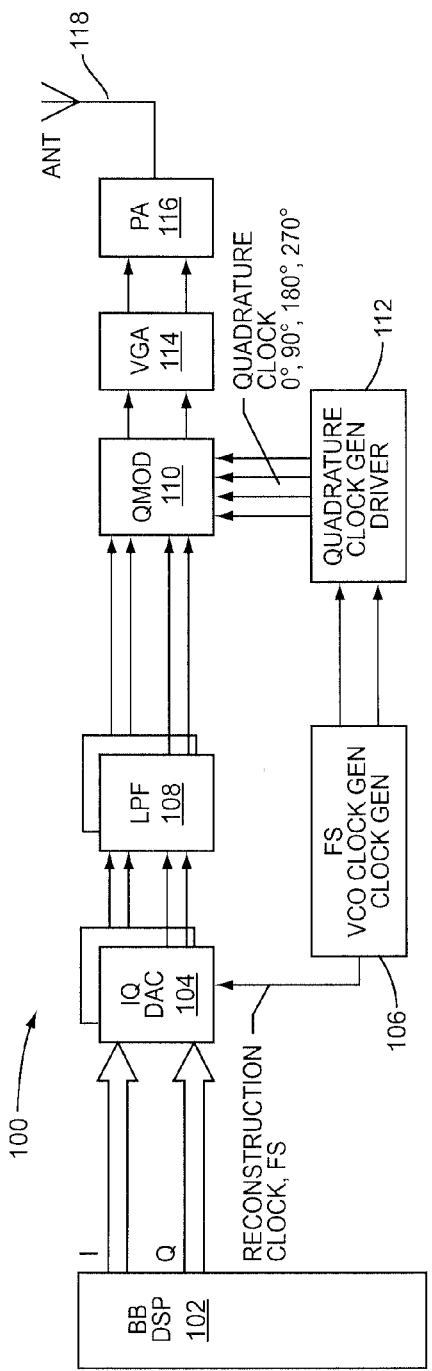
FIG. 20 is a functional block diagram of a prior art quadrature modulation transmitter.
Figure 21:
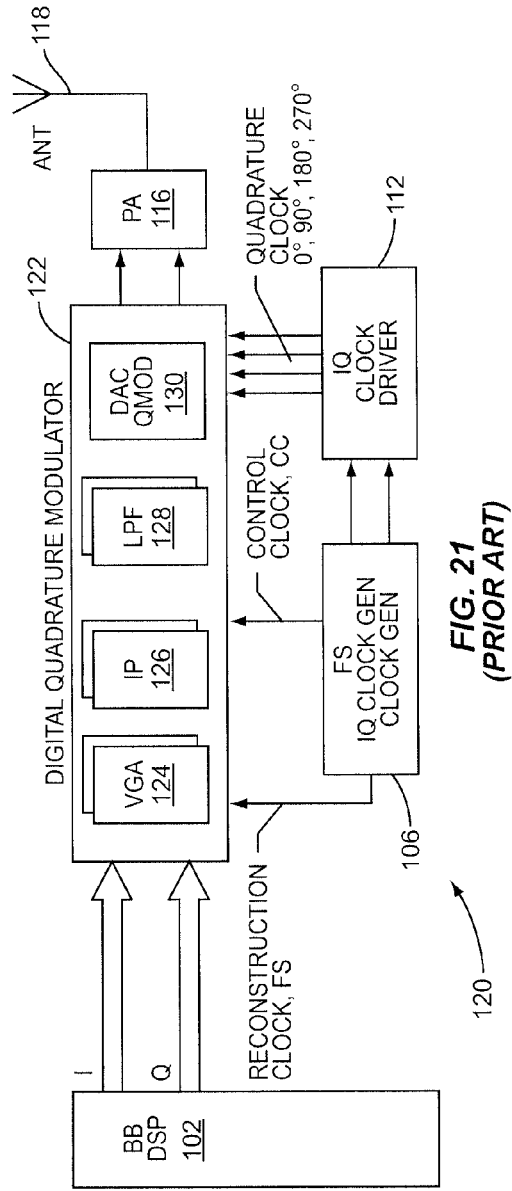
FIG. 21 is a functional block diagram of a prior art quadrature modulation transmitter featuring an integrated, digital quadrature modulator.
Figure 22:
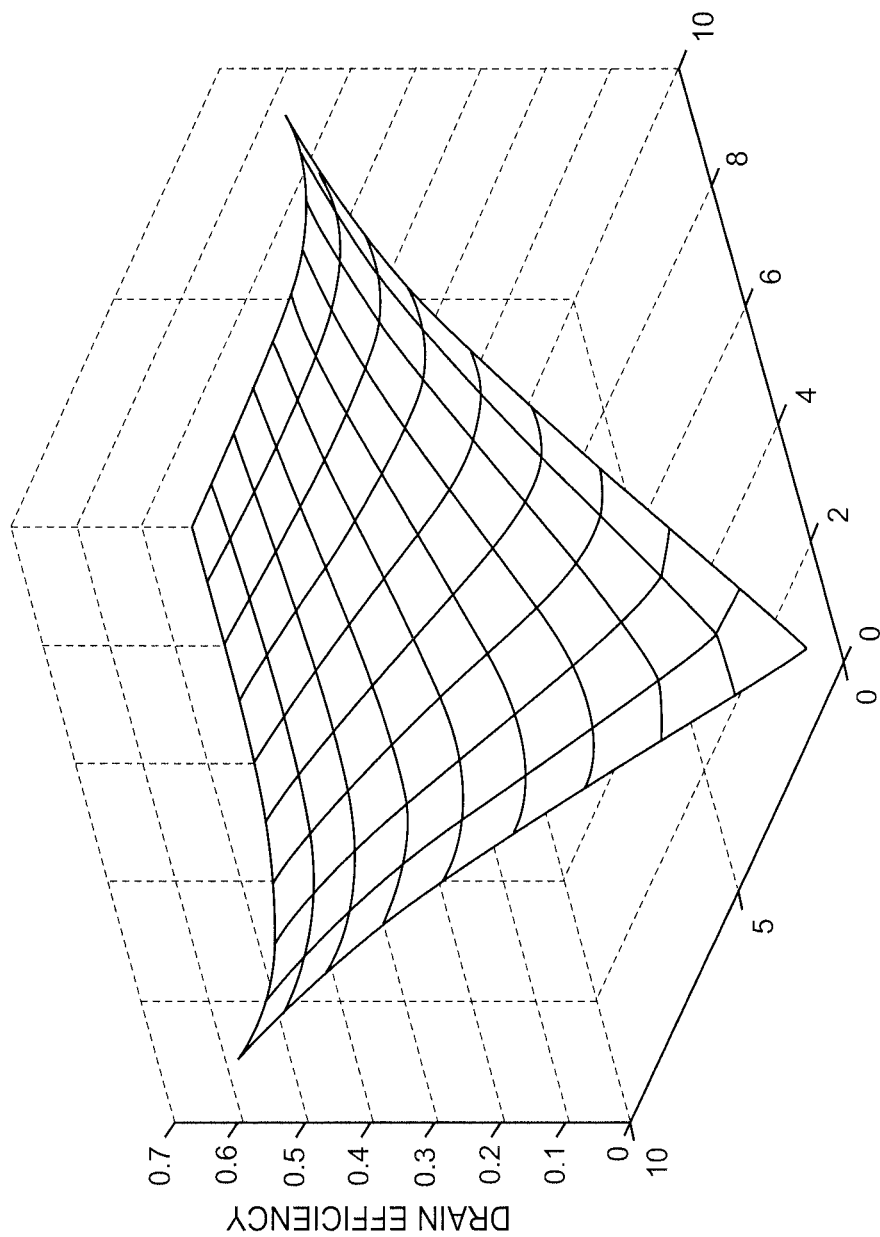
FIG. 22 is a graph depicting the drop in efficiency of the transmitter of FIG. 20 or 21 as the I and Q symbol components approach equality.

The simulation result is depicted in the first graph of FIG. 19. The current consumption as a function of the angle θ is depicted in the second graph. As these graphs demonstrate, the lower the angle θ, the higher the power efficiency. When the angle θ is 0, the DATMPA 14, 15 achieves the same power efficiency as polar modulation. When the angle θ is 90°, the DATMPA 14, 15 achieves the same power efficiency as quadrature modulation. As the angle θ=360/m, when m increases, θ decreases. It becomes saturated when m is large enough, and further improvement will be very small.

Although unique advantages derive from a digital implementation of affine transformation modulation, it can be implemented in analog modulators as well. In an analog affine transformation modulator, several different mixer cells, such as Gilbert cell, can be connected in parallel.

Although the baseband input signals have been described as quadrature Cartesian signals, other signals formats with two or more components may be advantageously mapped to an affine space, allowing implementation of the digital affine transformation modulation power amplifier described herein. As one example, the baseband input signals may be in polar format.

FIGS. 1, 7, and 12 depict the DATMPA 14, 15 as driving an antenna 16 directly; however, the present invention is not so limited. In one embodiment, a DATAM 14, 15 may generate a modulated carrier signal for a conventional power amplifier. For example, the DATAM 14, 15 may be integrated into a transceiver ASIC to generate the transmit signal that drives a separate power amplifier. Furthermore, those of skill in the art will readily appreciate that conventional matching components, such as filters, switches and duplexers, may be interposed between the DATMPA 14, 15 output and the physical antenna 16.

The affine transformation modulation, and digital affine transformation modulation power amplifier (DATMPA) 14, 15 implementing it, offer several advantages over the prior art. The DATMPA 14, 15 exhibits increased power efficiency over a quadrature modulator, approaching that of polar modulation. However, the DATMPA 14, 15 avoids detrimental issues in polar modulation, such as bandwidth expansion and group delay mismatch. The impedance compensation circuits 64 in the digital power amplifier 46, 47 maintain a constant output impedance regardless of whether the associated amplifier units 58, 60, 68, 70, 72 are enabled or disabled. This removes a phase shift problem normally associated with a switched power amplifier array, and reduces amplitude non-linearity at the power amplifier 46, 47 output. Additionally, the impact of switching amplifier units 58, 60, 68, 70, 72 between enabled and disabled states reduces transient behavior of the power amplifier 46, 47 output. Furthermore, the pre-distortion modules 40, 41 compensate for non-linearity in the power amplifier 46, 47. In one embodiment, the pre-distortion is accomplished in the digital domain via look-up tables.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A transmitter operative in a wireless communication system, comprising:
    a signal processing unit operative to generate a baseband digital signal comprising two or more components to be transmitted; and
    a digital affine transformation modulated power amplifier (DATMPA) in data receiving relationship to the signal processing unit and operative to modulate the baseband digital signal, map of the signal to an affine vector space comprising m radial sectors, wherein m is an integer, the boundaries of the sectors corresponding to predetermined boundary angles, whereby the signal is described as a sum of vectors lying along the predetermined boundary angles, and amplify the modulated signal;
    wherein the DATMPA comprises
        a digital affine transformation modulator (DATM); and
        a digital power amplifier (DPA) receiving only digital input.

2. The transmitter of claim 1 further comprising an antenna connected to the DATMPA and operative to transmit the amplified, modulated signal.

3. The transmitter of claim 1 wherein
    the received signal to be transmitted comprises in-phase (I) and quadrature phase (Q) components; and
    the transmitter is operative to map the I, Q Cartesian components of the signal to the affine vector space.

4. The transmitter of claim 1 wherein the DATM is further operative to output, for each received signal, at least two digital values, each representing a magnitude associated with one of the vectors, and further operative to output an indication of the predetermined boundary angles.

5. The transmitter of claim 4 wherein the DATM is further operative to output, for each received signal, a third digital value representing a magnitude associated with a predetermined boundary angle of a sector toward which the signal is moving.

6. The transmitter of claim 1 further comprising:
    a clock generator module operative to generate clock signals having phase relationships associated with the predetermined boundary angles;
    a clock selector module operative to select particular phase clock signals in response to and indication of the predetermined boundary angles from the DATM; and
    a clock driver module operative to provide selected phase clock signals to the DPA.

7. The transmitter of claim 6 wherein the DPA comprises a plurality of amplifier cells, the outputs of which are combined to form the DPA output, each amplifier cell comprising:
    a first amplifier unit, enabled by a corresponding bit of a first coded magnitude value and amplifying a first clock signal having a phase corresponding to the predetermined boundary angle associated with the first coded magnitude value; and
    a second amplifier unit, enabled by a corresponding bit of a second coded magnitude value and amplifying a second clock signal having a phase corresponding to the predetermined boundary angle associated with the second coded magnitude value.

8. The transmitter of claim 7 wherein the DATMPA further comprises a binary to thermometer code transformation module upstream of the DPA and operative to convert binary digital magnitude values output by the DATM to thermometer code magnitude values and to provide the thermometer code magnitude values to the DPA.

9. The transmitter of claim 7 wherein the amplifier units are single-ended.

10. The transmitter of claim 7 wherein the amplifier units are differential.

11. The transmitter of claim 7 wherein each amplifier unit includes an impedance compensation circuit operative to maintain a predetermined output impedance whether the amplifier unit is enabled or disabled.

12. The transmitter of claim 7 wherein each amplifier unit includes a shut-down circuit operative to prevent radio frequency leakage to the output of the DPA when the amplifier unit is disabled.

13. The transmitter of claim 7 wherein each amplifier cell in the DPA further comprises a third amplifier unit, enabled by a corresponding bit of a third coded magnitude value and amplifying a third clock signal having a phase corresponding to the predetermined boundary angle associated with the third coded magnitude value, the third magnitude value and third clock signal associated with a digital affine transform sector toward which the signal is moving.

14. The transmitter of claim 1 wherein the DATMPA further comprises a pre-distortion module upstream of the DPA, operative to alter the modulated signal to compensate for non-linear distortion introduced by the DPA.

15. The transmitter of claim 14 wherein the pre-distortion module utilizes a look-up table.

16. A method of modulating a signal for transmission by a digital affine transformation modulated power amplifier in a wireless communication system, comprising:
    providing a signal to be transmitted in two or more components;

mapping the components of the signal to an affine vector space comprising m radial sectors, wherein m is an integer, the boundaries of the sectors corresponding to predetermined boundary angles, whereby the signal is described as a sum of vectors lying along the predetermined boundary angles; and summing outputs of at least two amplifier units within a plurality of amplifier cells, each amplifier unit amplifying a clock signal with phase corresponding to one of the predetermined boundary angles; and selectively enabling amplifier units within each amplifier cell based on magnitudes of vectors having the corresponding predetermined boundary angles.

17. The method of claim 16 wherein the signal to be transmitted is provided in in-phase (I) and quadrature phase (Q) components.

18. The method of claim 17 further comprising:
defining one or more regions near the origin of the I, Q Cartesian coordinate space; and
modulating signals within the defined region by Quadrature Modulation.

19. The method of claim 16 further comprising:
defining one or more regions near the origin of the coordinate space; and
modulating signals within the defined regions by affine modulation using fewer sectors than outside the defined regions.

20. The method of claim 16 wherein selectively enabling amplifier units within each amplifier cell based on magnitudes of vectors comprises transforming each magnitude to a code, and enabling one amplifier unit in each amplifier cell based on the value of a corresponding bit of the coded magnitude value.

21. The method of claim 17 further comprising:
tracking movement of the signal within a sector;
predicting into which of two adjacent sectors the signal will move;
supplying a clock signal with phase corresponding to a predetermined boundary angle of the predicted sector that is not shared with a current sector, to a disabled, third amplifier unit within the plurality of amplifier cells; and
when the signal crosses into the predicted sector,
selectively enabling the third amplifier unit; and
disabling the amplifier unit clocked by a clock signal with phase associated with the boundary angle that is not shared with the predicted sector.

* * * * *

UNITED STATES PATENT AND TRADEMARK OFFICE
CERTIFICATE OF CORRECTION

PATENT NO. : 8,681,894 B2
APPLICATION NO. : 12/611677
DATED : March 25, 2014
INVENTOR(S) : Mu et al.

It is certified that error appears in the above-identified patent and that said Letters Patent is hereby corrected as shown below:

On the Title Page, Item (73), under "Assignee", in Column 1, Line 1, delete "L M" and insert -- L M Ericsson --, therefor.

On the Title Page, Item (56), under "OTHER PUBLICATIONS", in Column 2, Line 9, delete "Bandwith."" and insert -- Bandwidth." --, therefor.

In the Specification
+
In Column 5, Line 17, delete "I/O" and insert -- I/Q --, therefor.

In Column 6, Line 9, delete "I/O" and insert -- I/Q --, therefor.

In Column 6, Line 20, delete "I/O" and insert -- I/Q --, therefor.

In Column 11, Line 50, delete "I/O" and insert -- I/Q --, therefor.

In the Claims

In Column 15, Line 47, in Claim 1, after "map" insert -- the components --.

In Column 15, Line 53, in Claim 1, delete "comprises" and insert -- comprises: --, therefor.

In Column 15, Line 60, in Claim 3, delete "wherein" and insert -- wherein: --, therefor.

In Column 16, Line 14, in Claim 6, delete "and" and insert -- an --, therefor.

Signed and Sealed this
Second Day of September, 2014

Michelle K. Lee
*Deputy Director of the United States Patent and Trademark Office*